United States Patent
Belouet et al.

(10) Patent No.: US 6,743,345 B2
(45) Date of Patent: Jun. 1, 2004

(54) METHOD OF METALLIZING A SUBSTRATE PART

(75) Inventors: Christian Belouet, Sceaux (FR); Bertrand Joly, Sevres (FR); Didier Lecomte, Cavaillon (FR); Patricia Laurens, Paris (FR)

(73) Assignee: Nexans (FR)

( * ) Notice: Subject to any disclaimer, the term of this patent is extended or adjusted under 35 U.S.C. 154(b) by 0 days.

(21) Appl. No.: 10/097,146

(22) Filed: Mar. 13, 2002

(65) Prior Publication Data

US 2003/0031803 A1 Feb. 13, 2003

(30) Foreign Application Priority Data

Mar. 15, 2001 (FR) .............................................. 01 03718

(51) Int. Cl.⁷ .................................................. C25D 5/00
(52) U.S. Cl. ........................... 205/91; 430/56; 427/554; 427/437; 427/304
(58) Field of Search ............................ 205/91; 430/56; 427/554, 437, 304

(56) References Cited

U.S. PATENT DOCUMENTS

| | | |
|---|---|---|
| 3,674,485 A | 7/1972 | Jonker et al. |
| 4,426,442 A | 1/1984 | Molenaar et al. |
| 4,853,252 A | 8/1989 | Frankel et al. |
| 5,599,592 A * | 2/1997 | Laude .......................... 427/543 |

FOREIGN PATENT DOCUMENTS

EP  693138  8/1997

OTHER PUBLICATIONS

Search Report dated Nov. 8, 2001 for FR 0103718.

* cited by examiner

*Primary Examiner*—Wesley A. Nicolas
(74) *Attorney, Agent, or Firm*—Sofer & Haroun, LLP

(57) ABSTRACT

A process for metallizing a substrate part includes the following three steps: coating the part with a precursor composite material layer consisting of a polymer matrix doped with photoreducer material dielectric particles, irradiating the surface to be metallized of the substrate part with a light beam emitted by a laser, and immersing the irradiated part in an autocatalytic bath containing metal ions, with deposition of the latter in a layer on the irradiated surface. The dimension of the dielectric particles is less than or equal to 0.5 microns. The method is intended in particular for producing a metallized part including a substrate part consisting of a flexible film.

8 Claims, 1 Drawing Sheet

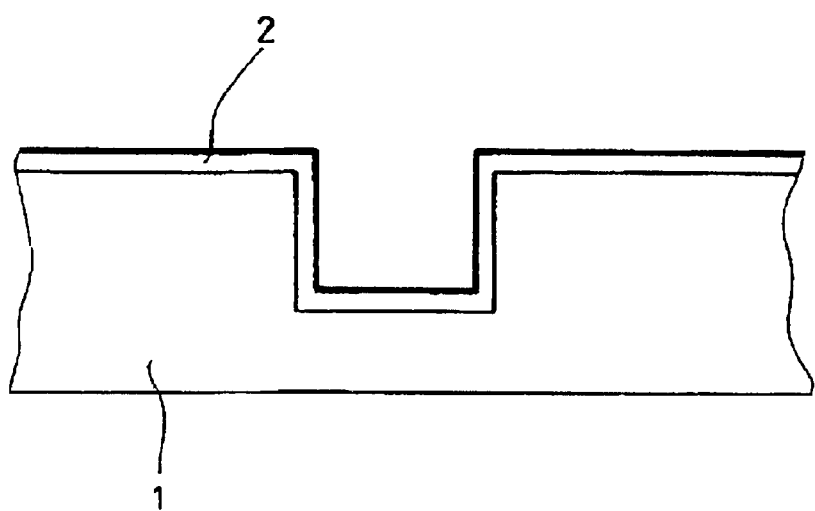

METHOD OF METALLIZING A SUBSTRATE PART

BACKGROUND OF THE INVENTION

1. Field of the Invention

The present invention relates to a method of metallizing a substrate part.

2. Description of the Prior Art

Metallized parts, in particular polymers, are used in many products. The product obtained can be used in printed circuit boards, connectors, printed antennas for the automobile industry, microchip cards, mobile telephones, etc.

Several metallization processes are known to the person skilled in the art.

Some include a plurality of steps by which adhesion to the surface of the polymer plastics material substrate part is obtained, often empirically, by heat treatment, chemical treatment, exposure to a plasma, irradiation with a low-energy beam of ions, or pulsed high-energy UV laser radiation. As a second step, a complex is deposited on the treated surface. This complex, consisting for example of a polymer resin soluble in water charged with a salt of a catalyst metal, for example palladium, impregnates the surface. This complex is activated before the metallization step, by means of a photochemical or thermal process, which reduces the catalyst metal to its metal form. Finally, metallization with copper can be obtained by autocatalytic deposition, possibly complemented by an electrolytic deposit for large thicknesses (typically greater than a few microns).

The above methods give rise to several problems; in particular the step of depositing a catalyst precursor on palladium to achieve good adhesion is particularly costly.

The invention concerns a process for metallizing a substrate part, including at least two steps:
- a step of irradiating the surface to be metallized of the substrate part with a light beam emitted by a laser,
- a subsequent step of immersing the irradiated part in an autocatalytic bath containing metal ions, with deposition of the latter in a layer on the irradiated surface.

A method of the above type is known from the patent EP-0 693 138 which describes a method for positive metallization of a composite plastics material substrate part containing a copolymer and grains of one or more metal oxides, the method including three successive steps, of which the first consists of irradiating the surface of the substrate part to be metallized with a light beam emitted by an excimer laser, the second consists of immersing the irradiated part in an autocatalytic bath containing metal ions and with no prior addition of palladium, with deposition of the latter in a layer on the irradiated surface, and the third step consists of heat treating the metallized metal part to obtain diffusion of the deposited metal into the composite material.

This method necessitates incorporating into the mass of the polymer plastics material a mineral substance dispersed in the plastics material and formed of grains of oxide, for example oxides of antimony, aluminum, iron, zinc and tin, in particular in concentrations by volume greater than 1%, and of varying size, preferably with a size greater than 0.5 $\mu$m and not exceeding 50 $\mu$m. These oxides are further diffused into the plastics material by the final heat treatment. The resulting adhesion is improved by causing the metal to diffuse toward the interior of the composite by selective short-team heating of the metal layer in a microwave oven.

The introduction of mineral substances into the polymer modifies the inherent properties of the polymer, which is detrimental, because the volume of the polymer is optimized for the application.

To solve this problem, consideration may be given to providing, prior to the first step, a step of coating the part with a layer of precursor composite material consisting of a polymer matrix doped with photoreducer material dielectric particles.

A process of the above kind is known from U.S. Pat. Nos. 4,426,442 and 4,853,252.

According to the above patents, the part is previously coated with a layer of photoreducer material. This layer consists of a polymer matrix doped with dielectric particles, to be more precise titanium dioxide particles.

In the methods described, there is no consideration of the precise dimension of the particles and the layer can be as much as 10 microns thick.

By "dimension" of the particles is meant the mean diameter of the particles.

It is found that if the particles are of relatively large dimension, the following technical problems arise.

First of all, for a constant fraction by volume of the particles in the polymer matrix, the effective adhesion forces of the metal ions subsequently deposited decrease as the size of the particles increases. It is therefore necessary to use high fractions by volume to obtain good retention of the metallization, which leads to a high material cost and limits the choice of the polymer, according to the compatibility of the polymer with the particles.

Also, to obtain a uniform deposit of metallization metal ions, it is necessary to deposit a relatively great thickness of metal ions. This is also particularly costly in material and a relatively rough deposit is obtained.

Finally, the lateral resolution of an area metallized in the above way is poor. By lateral resolution is meant the regularity of an edge of an area of this kind.

This makes it difficult to obtain precise and economically viable metallized areas of good quality, such as tracks of integrated circuits.

SUMMARY OF THE INVENTION

The invention solves the above problems and to this end proposes a process for metallizing a substrate part, including the following three steps: coating the part with a precursor composite material layer consisting of a polymer matrix doped with photoreducer material dielectric particles, irradiating the surface to be metallized of the substrate part with a light beam emitted by a laser, immersing the irradiated part in an autocatalytic bath containing metal ions, with deposition of the latter in a layer on the irradiated surface, and wherein the dimension of the dielectric particles is less than or equal to 0.5 microns.

The plastics material substrate part can consist of a doped or undoped polymer, for example a pure polymer not charged with grains of oxides, as in the case of non-polymer substrates, such as ceramics, in particular ceramics whose surface cannot be easily photoreduced by UV laser irradiation, glasses and semiconductors, among others.

The above process can be applied to parts of any shape, for example flat or cylindrical parts.

Also, the preparation of a composite material can exploit the rapid development of the technology of polymers doped with nanoparticles and in particular the chemical bonding of the nanoparticles with a polymer matrix by means of molecular ligands.

The polymer matrix is made from a material selected to obtain good adhesion at its interface with the substrate part. Its choice therefore depends on the material of the substrate part. Polyethylene, polypropylene, polycarbonate or polyimide are preferably used.

The dielectric particles are advantageously of photoreducer material, preferably oxides chosen from $ZnO$, $TiO_2$, $ZrO_2$, $Al_2O_3$ and $CeO_2$.

The composite material layer advantageously has a thickness of at most one micron, which thickness can be less if the size of the particles of oxides is nanometric.

The composite material layer can be applied by conventional techniques such as spinner deposition, dispersion, immersion coating, screenprinting, spraying or extrusion in the case of a substrate part of cable form.

In a preferred embodiment, in the case of a polymer plastics material substrate part, the composite layer is applied to the substrate part by laser plating, the dielectric particles being deposited on the surface of the polymer plastics material substrate part prior to laser heating using a dispersion technique or being injected by means of a nozzle during laser heating.

This is one embodiment. It is to be understood that, even in the case of a polymer substrate part, coating the part with a composite material layer may be envisaged, instead of coating the oxides powder on the surface of the substrate part, as described above.

After depositing the composite material layer, in the second step of the process, that layer is irradiated by a pulsed UV laser beam. This step aims to activate the surface of the small dielectric particles exposed by simultaneous ablation of the coating polymer, for subsequent autocatalytic deposition of metal, for example copper. This operation can be carried out in two different ways: irradiation of the whole of the surface of the part, or irradiation through a projection mask in order to activate only the surface to be metallized.

If the composite is deposited by screenprinting, the future tracks are already drawn. The whole of the surface of the substrate part can then be irradiated, because only the tracks will be activated for the subsequent autocatalytic deposition.

The use of dielectric nanoparticles has several advantages very smooth surfaces are obtained with a high lateral resolution. High surface coverage values of the activated dielectric area are also obtained, obtaining a homogeneous film of metallization and an adhesion of more than 1 $kg/mm^2$. For example, in the case of 100 nm diameter particles of $ZnO$, the coverage of the surface by the activated surface can approach 50% for a fraction by volume of nanoparticles not exceeding 10%.

Using a projection mask during laser irradiation avoids the need for a photolithography step to delimit the metallization area in the case of partial metallization. In this regard, the process is compatible with changes of level between two surfaces of the product to be metallized.

The third step of the process includes autocatalytic deposition of metal, preferably copper, by immersing the part in an autocatalytic bath, as in the prior art cited in the preamble to this description. In the case of partial metallization, starting from a surface that is entirely covered, a photolithographic step is then necessary, between laser irradiation and immersion in the autocatalytic bath, to delimit the surfaces to be metallized.

After the autocatalytic deposition, which yields a thickness of at most a few microns, the film can be completed by electrolytic deposition employing processes known to the person skilled in the art. This deposition is faster and less costly than autocatalytic deposition, which is indispensable only in the initial phase for obtaining good adhesion to the surface of the oxide and the production of a continuous film. Equally, autocatalytic deposition can be strengthened by another process, for example wave deposition of tin.

The new process separates optimization of the properties of the polymer plastics material substrate part, on the one hand, and of the constituents of the metallization, on the other hand. The polymer used for the metallization during the first step can be different from that of the substrate part. For example, it is possible to select for the metallization a polymer material that has a relatively high absorption at the wavelength of 248 nm, which is the wavelength of the most widely used excimer lasers available off the shelf.

BRIEF DESCRIPTION OF THE FIGURES

The sole FIGURE illustrates a metallized part placed on a support, in accordance with one embodiment of the present invention.

DETAILED DESCRIPTION OF THE PREFERRED EMBODIMENTS

A first embodiment of the process is described in detail below.

In a first step, a composite material layer of polymer charged with zinc oxide $ZnO$ is applied by laser plating to a polymer material, for example polycarbonate, substrate part. This is obtained by moving the polymer surface at a constant speed from approximately 10 mm/s to approximately 100 mm/s under a continuous laser beam, preferably a beam from a $CO_2$ laser. The power of the laser is selected in a range of several tens of watts to several hundred watts, to heat the polymer surface and to coat ceramic particles under the surface of the polymer rendered viscous. The ceramic powder is deposited on the polymer surface prior to laser heating, using a standard dispersion technique, or is injected during laser heating by means of a nozzle. Using this technique, the 0.5 micron size $ZnO$ particles are buried in the treated surface of the polymer. The thickness and the composition of the composite layer can be varied by varying the parameters of the laser, i.e. its power and scanning speed.

In the second step of the process the composite layer is activated by a pulsed UV excimer laser (wavelength 193 nm). This operation is carried out with the following laser parameters: 50 to 200 pulses at a flow of close to 500 $mJ/cm^2$.

Autocatalytic deposition of copper then follows in the third step of the process. The metallization is obtained only over laser-treated areas. An adhesion of 1.4 $kg/mm^2$ is therefore obtained at the level of the metallization to the copper. This adhesion can be measured by a standard traction test. The traction tests are carried out by gluing metal pins (diameter 2 mm) to the copper tracks to be tested. The pins are pulled perpendicularly to the sample at an increasing force until separation occurs, in order to determine the adhesion.

A second embodiment of the process is described in detail hereinafter.

In the first step a layer of polymer composite material charged with particles of zinc oxide $ZnO$ having a mean diameter less than or equal to 0.5 microns is applied to a polymer material substrate part by the spinner process with a rotation speed of 500 rpm to 2000 rpm.

The substrate part is a polycarbonate or silicon plate 500 $\mu$m thick.

The polymer matrix is poly[bisphenol A carbonate-co-4,4'-(3,3,5-trimethylcyclohexylidene) diphenol carbonate] and the composite material is contained in a solvent, preferably 1,2 dichloroethane.

The usual dispersants are added to the precursor material.

In the second step of the process, the composite material is activated by a pulsed UV excimer laser (wavelength 193 nm). This operation is carried out with the following laser parameters: 1 to 5 pulses at a flow close to 500 mJ/cm$^2$.

The third step of the process is autocatalytic deposition of copper.

The invention further concerns a part metallized by the process previously described, including a substrate part consisting of a flexible film.

Said film is advantageously constituted of a plastics material and in particular a polymer, preferably polyethylene or polyimide.

Apart from solving the technical problems already specified, the invention can produce a thin film of metallized plastics material which is particularly thin. This type of film can find an application in metallizing substrate areas of complex shape. Direct metallization treatment in accordance with the invention can be very complex even impossible to carry out in such areas. For example, it can be very difficult to perform laser irradiation in recessed shapes to be metallized by the process according to the invention over all of the surface of the recess. Thanks to the invention, in such cases, the metallized film is deposited on the surface, for example by gluing.

A metallized part of the above kind placed on a support is shown in the FIGURE, which is a lateral view of the support.

The support 1 is a card, for example an epoxy or polycarbonate card reinforced with glass fibers, having a groove on its top surface. To produce a conductive track on the card and inside the groove, a film 2 metallized by the process according to the invention is fixed, for example glued, to the surface of the card.

Note that metal ions can be deposited on the irradiated surface of the attached film either before or after gluing it. Depending on the curvatures, it may be advantageous to deposit it afterwards. This is possible because the area irradiated by the laser remains active long after irradiation. It has been found experimentally that this activation lasts several months after irradiation.

A third embodiment of the process, relating more specifically to the fabrication of a metallized film of the above kind, is described in detail hereinafter.

A polyethylene, polyimide or Mylar film having a thickness of 50 microns, for example, is extruded. More generally, a thickness from 10 microns to 1 mm can be envisaged. The film is passed continually and in series into a bath for depositing the precursor composite material and then in a drying oven followed by heating, for example by $CO_2$ laser irradiation, and then irradiation by an activation excimer laser. Static immersion in an autocatalytic bath or slow passage through the bath can produce a thickness of metal from 0.5 micron to 10 microns.

A laminated composite film of the above kind can therefore be fabricated continuously.

Selective metallization of complex surfaces with a high definition and an accuracy of the order of 1 micron can also be obtained for radio frequency protection of the screen type or electronic circuitry in printed circuit, integrated circuit, magnetic card, microchip card, etc. type applications.

The basic films are then treated in sequence in the irradiation phase by an excimer laser through a mask to print on the film the exact and precise shape of the required metallization that appears during subsequent passage through the autocatalytic bath.

Note also that applications of the process according to the invention to fabrication of selective membranes, films for decorative use or for printing are also feasible.

There is claimed:

1. A process for metallizing a substrate part, comprising: coating said part with a precursor composite material layer consisting of a polymer matrix doped with photoreducer material dielectric particles; irradiating the surface to be metallized of said substrate part with a light beam emitted by a laser; and immersing the irradiated part in an autocatalytic bath containing metal ions, with deposition of the latter in a layer on the irradiated surface, and wherein the dimension of said dielectric particles is less than or equal to 0.5 microns.

2. The method claimed in claim 1, wherein said dielectric particles are oxides chosen from $ZnO$, $TiO_2$, $ZrO_2$, $Al_2O_3$, and $CeO_2$.

3. The method claimed in claim 1, wherein said composite material layer is approximately 1 micron thick.

4. The method claimed in claim 1, wherein said immersion step is completed by a step of electrolytic deposition.

5. The method claimed in claim 1, wherein said substrate part is made of a polymer plastics material and said composite layer is applied to said polymer plastics material substrate layer by laser plating.

6. The method claimed in claim 5, wherein said dielectric particles are deposited on the surface of said polymer plastics material substrate part prior to laser heating in accordance with a dispersion technique.

7. The method claimed in claim 5, wherein said dielectric particles are injected by means of a nozzle during laser heating.

8. A process for metallizing a substrate part, comprising: coating said part with a precursor composite material layer, 1 micron in thickness, consisting of a polymer matrix doped with photoreducer material dielectric particles; irradiating the surface to be metallized of said substrate part with a light beam emitted by a laser; and immersing the irradiated part in an autocatalytic bath containing metal ions, with deposition of the latter in a layer on the irradiated surface, and wherein the dimension of said dielectric particles is less than or equal to 0.5 microns.

* * * * *